US011164817B2

(12) United States Patent
Rubin et al.

(10) Patent No.: US 11,164,817 B2
(45) Date of Patent: Nov. 2, 2021

(54) MULTI-CHIP PACKAGE STRUCTURES WITH DISCRETE REDISTRIBUTION LAYERS

(71) Applicant: International Business Machines Corporation, Armonk, NY (US)

(72) Inventors: Joshua M. Rubin, Albany, NY (US); Kamal K. Sikka, Poughkeepsie, NY (US); Steven Lorenz Wright, Cortlandt Manor, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/671,411

(22) Filed: Nov. 1, 2019

(65) Prior Publication Data

US 2021/0134724 A1 May 6, 2021

(51) Int. Cl.
*H01L 25/18* (2006.01)
*H01L 23/538* (2006.01)
(Continued)

(52) U.S. Cl.
CPC ...... *H01L 23/5381* (2013.01); *H01L 21/4853* (2013.01); *H01L 21/565* (2013.01);
(Continued)

(58) Field of Classification Search
CPC ............. H01L 23/5381; H01L 21/4853; H01L 21/565; H01L 21/568; H01L 25/105; H01L 25/18
See application file for complete search history.

(56) References Cited

U.S. PATENT DOCUMENTS 5,534,466 A 7/1996 Perfecto et al.
8,008,764 B2 8/2011 Joseph et al.
(Continued)

FOREIGN PATENT DOCUMENTS

| WO | 2017164810 A1 | 9/2017 |
| WO | 2017196257 A1 | 11/2017 |
| WO | 2018009145 A1 | 1/2018 |

OTHER PUBLICATIONS

J. Ferguson et al., "Implementing Fan-Out Wafer-Level Packaging (FOWLP) with the Mentor HDAP Flow," https://www.3dincites.com/wp-content/uploads/mentorpaper_98612.pdf, White Paper, 2017, 14 pages.
(Continued)

*Primary Examiner* — Timor Karimy
(74) *Attorney, Agent, or Firm* — Jeffrey S. LaBaw; Ryan, Mason & Lewis, LLP

(57) ABSTRACT

Techniques are provided for constructing multi-chip package structures. For example, a multi-chip package structure includes a package substrate, an interconnect bridge device, a first chip package, and a second chip package. The first chip package includes a first redistribution layer structure, and a first integrated circuit chip connected to the first redistribution layer structure. The first redistribution layer structure is connected to the interconnect bridge device and to the package substrate. The second chip package includes a second redistribution layer structure, and a second integrated circuit chip connected to the second redistribution layer structure. The second redistribution layer structure is connected to the interconnect bridge device and to the package substrate. The interconnect bridge device includes wiring to provide package-to-package connections between the first and second chip packages.

20 Claims, 12 Drawing Sheets

(51) Int. Cl.
  *H01L 25/10* (2006.01)
  *H01L 21/56* (2006.01)
  *H01L 21/48* (2006.01)
(52) U.S. Cl.
  CPC .......... *H01L 21/568* (2013.01); *H01L 25/105* (2013.01); *H01L 25/18* (2013.01)

(56) References Cited

U.S. PATENT DOCUMENTS

| | | |
|---|---|---|
| 8,064,224 B2 | 11/2011 | Mahajan et al. |
| 8,138,015 B2 | 3/2012 | Joseph et al. |
| 8,227,904 B2 | 7/2012 | Braunisch et al. |
| 8,866,308 B2 | 10/2014 | Roy et al. |
| 8,901,748 B2 | 12/2014 | Manusharow et al. |
| 9,059,179 B2 | 6/2015 | Karikalan et al. |
| 9,269,701 B2 | 2/2016 | Starkston et al. |
| 9,275,955 B2 | 3/2016 | Mahajan et al. |
| 9,368,450 B1 * | 6/2016 | Gu ...................... H01L 25/0655 |
| 9,431,347 B2 | 8/2016 | Kunieda et al. |
| 9,601,463 B2 | 3/2017 | Yu et al. |
| 9,653,428 B1 | 5/2017 | Hiner et al. |
| 9,704,790 B1 | 7/2017 | Wu et al. |
| 9,754,890 B2 | 9/2017 | Deshpande et al. |
| 9,847,324 B2 | 12/2017 | Lin et al. |
| 2003/0199121 A1 | 10/2003 | Caletka et al. |
| 2008/0224316 A1 | 9/2008 | Kroeninger et al. |
| 2011/0312129 A1 | 12/2011 | Joseph et al. |
| 2012/0261838 A1 | 10/2012 | Braunisch et al. |
| 2013/0168849 A1 * | 7/2013 | Scanlan ................. H01L 23/48 257/737 |
| 2013/0168854 A1 | 7/2013 | Karikalan et al. |
| 2014/0057411 A1 | 2/2014 | Hoang et al. |
| 2014/0091474 A1 | 4/2014 | Starkston et al. |
| 2014/0130969 A1 | 5/2014 | McCutcheon et al. |
| 2014/0252599 A1 | 9/2014 | Kwon et al. |
| 2014/0360759 A1 | 12/2014 | Kunieda et al. |
| 2015/0171015 A1 | 6/2015 | Mahajan et al. |
| 2015/0364422 A1 | 12/2015 | Zhai et al. |
| 2016/0240457 A1 | 8/2016 | Lee |
| 2016/0293572 A1 | 10/2016 | We et al. |
| 2016/0307870 A1 | 10/2016 | Kelly et al. |
| 2016/0343666 A1 | 11/2016 | Deshpande et al. |
| 2016/0372448 A1 | 12/2016 | Yazdani |
| 2017/0110419 A1 | 4/2017 | Shih et al. |
| 2017/0125334 A1 * | 5/2017 | Wang .................. H01L 23/3114 |
| 2017/0271307 A1 | 9/2017 | Hiner et al. |
| 2018/0102251 A1 | 4/2018 | Delacruz et al. |
| 2018/0102470 A1 * | 4/2018 | Das ..................... H01L 39/2493 |
| 2018/0158712 A1 | 6/2018 | Ekkels et al. |
| 2018/0286840 A1 | 10/2018 | Nair et al. |

OTHER PUBLICATIONS

H. Braunisch et al., "High-Speed Performance of Silicon Bridge Die-to-Die Interconnects," IEEE 20th Conference on Electrical Performance of Electronic Packaging and Systems (EPEPS), Oct. 23-26, 2011, pp. 95-98.

R. Mahajan et al., "Embedded Multi-Die Interconnect Bridge (EMIB)—A High Density, High Bandwidth Packaging Interconnect," IEEE 66th Electronic Components and Technology Conference (ECTC), May 31-Jun. 3, 2016, pp. 557-565.

K. Oi et al., "Development of New 2.5D Package with Novel Integrated Organic Interposer Substrate with Ultra-fine Wiring and High Density Bumps," IEEE 64th Electronic Components and Technology Conference (ECTC), May 27-30, 2014, pp. 348-353.

C. Narayan et al., "Thin Film Transfer Process for Low Cost MCM-D Fabrication," Proceedings of the International Conference on Multichip Modules (MCM), Apr. 13-15, 1994, pp. 105-114.

S. Ravichandran et al., "2.5D Glass Panel Embedded (GPE) Packages with Better I/O Density, Performance, Cost and Reliability than Current Silicon Interposers and High-Density Fan-Out Packages," IEEE 68th Electronic Components and Technology Conference (ECTC), May 29-Jun. 1, 2018, pp. 625-630.

U.S. Appl. No. 16/553,453 filed in the name of Joshua Rubin et al. on Aug. 28, 2019 and entitled "Multi-Chip Package Structure Having Chip Interconnection Bridge Which Provides Power Connections Between Chip and Package Substrate."

U.S. Appl. No. 16/043,503 filed in the name of Joshua Rubin et al. on Jul. 24, 2018 and entitled "Multi-Chip Package Structure Having Chip Interconnection Bridge Which Provides Power Connections Between Chip and Package Substrate."

* cited by examiner

400

500

MULTI-CHIP PACKAGE STRUCTURES WITH DISCRETE REDISTRIBUTION LAYERS

TECHNICAL FIELD

This disclosure generally relates to semiconductor packaging techniques and, in particular, to techniques for constructing multi-chip package structures.

BACKGROUND

Innovations in semiconductor fabrication and packaging technologies have enabled the development of smaller scale, higher density integrated circuit (IC) chips (or dies), as well as the development of highly integrated chip modules with wiring and area array input/output (I/O) contact densities that enable dense packaging of IC chips (or dies). For certain applications, high-performance electronic modules are constructed with one or more multi-chip modules (MCMs) mounted to a circuit board (e.g., a system board (or node card), a printed circuit board, a printed wiring board, etc.) using a suitable area array connection technique for module-to-board I/O interconnections (e.g., land grid array (LGA) or ball grid array (BGA) connections). MCM technology can be utilized to form a first level package structure with high-density packaging of multiple IC processor chips for computer server applications, or multiple heterogeneous chips for custom applications, etc.

Various conventional techniques can be utilized to construct an MCM package structure. For example, an MCM can be constructed by connecting multiple semiconductor IC dies directly to a package substrate. The semiconductor IC dies can be connected to a surface of the package substrate using wiring bonding, tape bonding, or flip-chip bonding. For high performance and high-density packages, direct chip attachment (DCA) techniques are commonly used for flip-chip bonding IC dies to the package substrate using area arrays of solder interconnects formed between contact pads on active surfaces of the semiconductor IC dies and matching arrays of contact pads formed on a chip mounting surface (or top-side surface) on the package substrate. The package substrate includes wiring for providing die-to-die connections between IC dies mounted to the top-side of the package substrate, as well as wiring for connecting the top-side contacts pads to bottom-side contact pads.

In conventional MCM technologies, the package substrate can be, e.g., a glass-ceramic substrate, or a laminate substrate. For example, a multi-layer ceramic package substrate can be fabricated using low-temperature co-fired ceramic (LTCC) substrate technology. In addition, a laminate package substrate can be fabricated using surface laminate circuit (SLC) technology to produce low-cost organic package substrates with build-up layers that are vertically connected through micro-vias to support solder-bumped flip-chips.

There is a continued demand for IC chips with increasing integrated functionality and smaller footprint sizes, which leads to increases in the I/O count and I/O density of the IC chips. Moreover, high-performance and high-density integrated package solutions typically require small micro-bumps for flip-chip connectivity using contact pitches of, e.g., 50 microns or less, and line width and line spacing design rules of 10 microns or less. While an MCM package structure allows heterogeneous IC dies to be directly connected (e.g., DCA) to each other through the package substrate, conventional ceramic-based package substrate and laminate substrate technologies are limited with regard to the smallest achievable contact pad pitch, line width and line spacing. As such, conventional ceramic and organic laminate build up substrates are a bottleneck to high-density packaging, as such substrate technologies cannot support the tight pitches needed for high-density I/O flip-chip connections and high-density die-to-die interconnections.

To address these limitations, 2.5-D packaging techniques are utilized to increase I/O density and provide high-density routing for low power die-to-die communication. In general, 2.5-D integration involves flip-chip bonding multiple IC dies on a passive interposer substrate (e.g., silicon, glass, or fine-pitch organic build substrate), wherein the passive interposer substrate is bonded to the package substrate. As compared to the package substrate, the interposer comprises finer pitch wiring, higher contact pad densities, and shorter distances for die-to-die interconnects.

A silicon interposer for 2.5D packaging consists of a thin layer of silicon which is disposed between the IC dies and the package substrate, and which comprises through-silicon vias (TSVs) to provide a platform with high wiring density for I/O redistribution and die-to-die communication. Silicon interposers require large and expensive silicon chips with TSVs to accommodate multiple chips on the top surface. Unfortunately, silicon interposers are expensive due to the size of the silicon interposer chip needed to accommodate the footprints of multiple dies attached to the surface of the silicon interposer, and due to the use of TSV technology which increases fabrication costs and complexity.

On the other hand, a fine-pitch organic build-up interposer for 2.5D packaging utilizes thin film technology to build fine-pitch organic redistribution layers on top of a conventional organic laminate substrate. While the fine-pitch organic redistribution layers provide a platform with high wiring density for I/O redistribution and die-to-die communication, such technology is limited in the number of fine-pitch redistribution layers and minimum wire pitch that is achievable, as compared to silicon-based interposer solutions.

Other 2.5D packaging solutions utilize silicon bridge devices that are embedded into a package substrate to provide tighter interconnect density between adjacent dies. The silicon bridge devices are lower in cost than conventional silicon interposers as silicon bridge devices are much smaller (they only connect to peripheral regions of adjacent dies) and do not utilize costly TSVs. Although silicon bridge devices are simple in form, conventional bridge devices are designed to only include wiring for die-to-die interconnection, but not wiring for, e.g., vertical power distribution through the bridge device from the package substrate to the dies.

However, with increasing IC die functionality and density, there is a need for an increasing number of power and ground pins to minimize ground bounce. As such, IC dies are typically fabricated with power/ground pads dispersed over the area array of I/O contact pads on the back-side of the IC dies. When silicon bridge devices are used for high-density die-to-die I/O interconnections, the bridge devices block vertical power distribution through the bridge structure to power/ground pads that are disposed within the high-density I/O areas of the IC dies which are overlapped by the bridge devices. As such, connections to such power/ground pads must be made from the package substrate to other regions of the IC dies which are not overlapped by the bridge devices, and then routed through the IC dies (as well as through lateral interconnection in the bridge devices) to the power/ground pads blocked by the bridge devices. This configuration increases the length of the power/ground traces, thus increasing the voltage drop and IR heating within the package substrate.

SUMMARY

Embodiments of the disclosure include multi-chip package structures comprising interconnect bridge devices and chip packages with discrete redistribution layers, as well as methods for fabricating such multi-chip package structures.

For example, one embodiment includes a package structure which comprises a package substrate, an interconnect bridge device, a first chip package, and a second chip package. The first chip package comprises a first redistribution layer structure and a first integrated circuit chip connected to the first redistribution layer structure. The first redistribution layer structure is connected to the interconnect bridge device and to the package substrate. The second chip package comprises a second redistribution layer structure and a second integrated circuit chip connected to the second redistribution layer structure. The second redistribution layer structure is connected to the interconnect bridge device and to the package substrate. The interconnect bridge device comprises wiring to provide package-to-package connections between the first and second chip packages.

Another embodiment of the disclosure includes a method for constructing a package structure. The method comprises forming a first chip package comprising a first redistribution layer structure and a first integrated circuit chip connected to the first redistribution layer, and forming a second chip package comprising a second redistribution layer structure and a second integrated circuit chip connected to the second redistribution layer. The first and second chip packages, are assembled together with an interconnect bridge device and a package substrate to form a package structure in which the first and second redistribution layer structures are connected to the interconnect bridge device and to the package substrate. The interconnect bridge device comprises wiring to provide package-to-package connections between the first and second chip packages.

Another embodiment of the disclosure includes a method for constructing a package structure. The method comprises forming a chip package structure comprising a plurality of integrated circuit chips bonded to a redistribution layer structure, and dicing the chip package structure into a plurality of individual chip package structures, wherein each individual chip package structure comprises at least one of the plurality of integrated circuit chips and a portion of the redistribution layer structure. A multi-chip package structure is constructed with at least one of the individual chip package structures bonded to an interconnect bridge device.

Other embodiments of the disclosure will be described in the following detailed description of embodiments, which is to be read in conjunction with the accompanying figures.

BRIEF DESCRIPTION OF THE DRAWINGS

FIGS. 6A, 6B, 6C, 6D, 6E, 6F, and 6G schematically illustrate a process flow for fabricating a multi-chip package structure according to an embodiment of the disclosure, wherein:

FIG. 6A is a schematic cross-sectional side view of a wafer-level chip package structure at an intermediate stage of fabrication in which a wafer-level RDL structure is formed over a surface of a temporary carrier substrate;

FIG. 6B is a schematic cross-sectional side view of the wafer-level chip package structure of FIG. 6A after flip-chip bonding a plurality of IC chips to the wafer-level RDL structure using solder bump connections;

FIG. 6C is a schematic cross-sectional side view of the wafer-level chip package structure of FIG. 6B after forming layers of underfill material between the active surfaces of the IC chips and an upper surface of the wafer-level RDL structure and after forming a molding layer to encapsulate the IC chips;

FIG. 6D is a schematic cross-sectional side view of the wafer-level chip package structure of FIG. 6C after removing the temporary carrier substrate from the bottom surface of the wafer-level RDL structure and forming arrays of solder bumps on the bottom surface of the wafer-level RDL structure;

FIG. 6E is a schematic cross-sectional side view of an intermediate package structure after dicing the wafer-level chip package structure of FIG. 6D to form individual, discrete, chip package structures, and after joining an interconnect bridge device to first and second chip package structures using a "chip first" assembly process;

FIG. 6F is a schematic cross-sectional side view of a package structure that is assembled by connecting the subassembly of the IC chip packages and the interconnect bridge device of FIG. 6E to a package substrate; and FIG. 6G illustrates an initial stage of a "bridge first" assembly process for constructing the assembly of the interconnect bridge device and the first and second chip package structures, as shown in FIG. 6E.

FIGS. 7A, 7B, 7C, and 7D schematically illustrate a process for fabricating a multi-chip package structure according to another embodiment of the disclosure, wherein:

FIG. 7A is a schematic cross-sectional side view of a wafer-level chip package structure at an intermediate stage of fabrication in which first and second IC chips are mounted to a carrier substrate and encapsulated in a molding layer;

FIG. 7B is a schematic cross-sectional side view of the wafer-level chip package structure of FIG. 7A after removing the carrier substrate to expose active surfaces of the first and second IC chips, and after bonding a handler substrate to the backside surfaces of the first and second IC chips and the molding layer;

FIG. 7C is a schematic cross-sectional side view of the wafer-level chip package structure of FIG. 7B after forming a wafer-level RDL structure over the active surfaces of the first and second IC chips, and after forming solder bumps on the RDL structure; and FIG. 7D schematically illustrates individual chip-package structures that are obtained by dicing the wafer-level chip package structure of FIG. 7C into discrete chip package structures.

DETAILED DESCRIPTION

Figure 1:
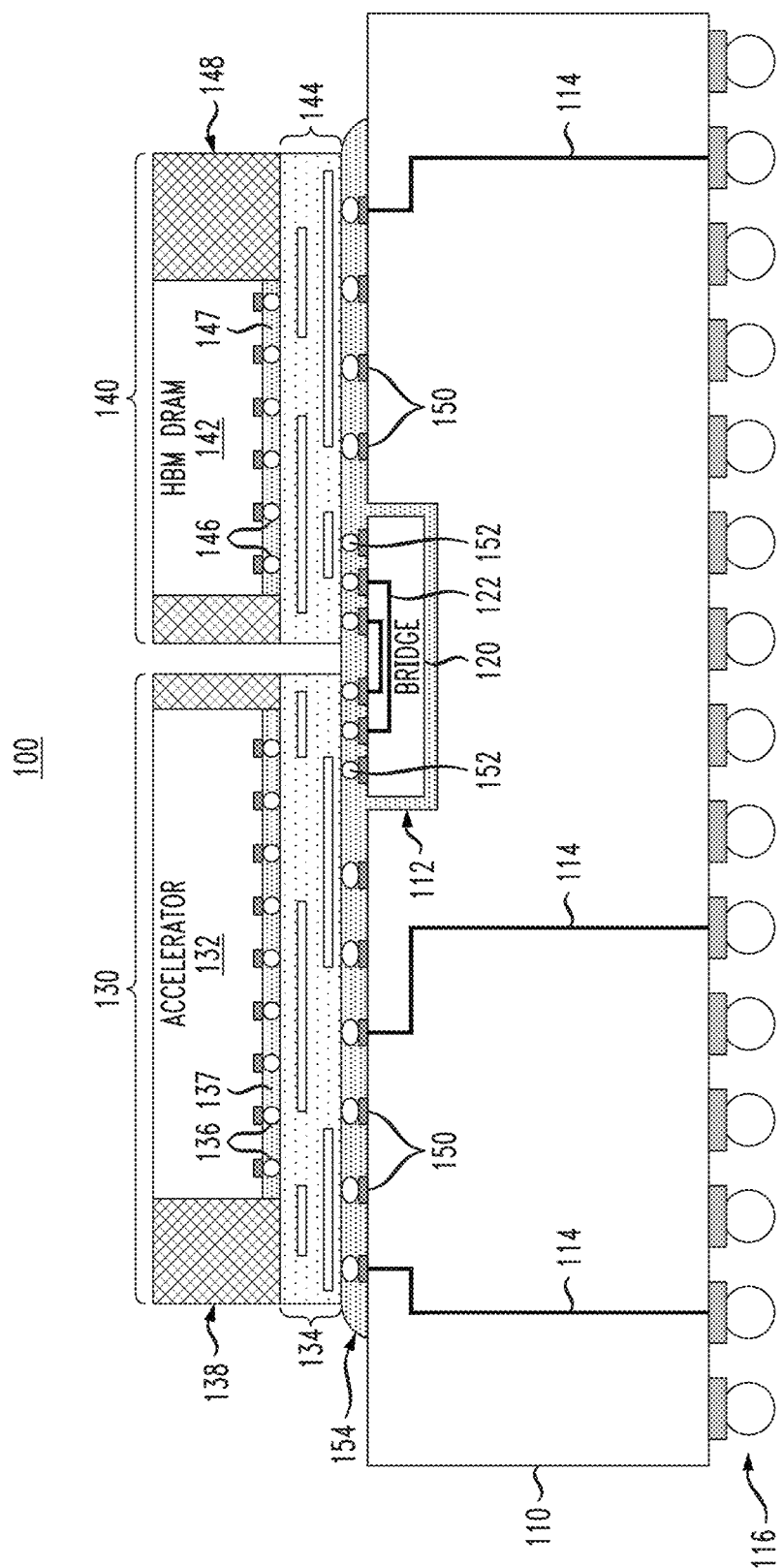
FIG. 1 schematically illustrates a multi-chip package structure according to an embodiment of the disclosure.

Embodiments of the disclosure will now be discussed in further detail with regard to multi-chip package structures which comprise an assembly of an interconnect bridge device and multiple chip packages with discrete redistribution layers, as well as methods for fabricating such multi-chip package structures. The interconnect bridge device is designed to provide high I/O interconnect density and high bandwidth signal distributions between two or more individual chip packages that are connected to the interconnect bridge device using solder bump interconnects. In addition, the interconnect bridge device may include lateral power distribution wiring through the interconnect bridge device to supply power (and ground) connections between individual chip packages connected to the interconnect bridge device.

The chip packages are formed by constructing wafer-level or panel-level (collectively, wafer/panel-level) chip package structures in which multiple IC chips are bonded to a single wafer/panel-level redistribution layer (RDL) structure. The wafer/panel-level chip package structure is diced into individual chip package structures, wherein each individual chip package structure comprises one or more IC chips that are connected to a discrete redistribution layer structure which comprises portion of the initial wafer/panel-level redistribution layer structure. As explained in further detail below, the wafer/panel-level RDL structures can be formed to include fan-out and/or fan-in RDL structures as desired for each of the IC chips.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount. The term "exemplary" as used herein means "serving as an example, instance, or illustration". Any embodiment or design described herein as "exemplary" is not to be construed as preferred or advantageous over other embodiments or designs. The word "over" as used herein to describe forming a feature (e.g., a layer) "over" a side or surface, means that the feature (e.g. the layer) may be formed "directly on" (i.e., in direct contact with) the implied side or surface, or that the feature (e.g., the layer) may be formed "indirectly on" the implied side or surface with one or more additional layers disposed between the feature (e.g., the layer) and the implied side or surface. The term "wafer/panel-level" as used herein refers to wafer-level or panel-level.

FIG. 1 schematically illustrates a multi-chip package structure 100 according to an embodiment of the disclosure. The multi-chip package structure 100 comprises package substrate 110, an interconnect bridge device 120, a first chip package 130, and a second chip package 140. The package substrate 110 can be a ceramic substrate, a silicon substrate or an organic laminate build-up substrate, or any other type of package substrate technology that is suitable for the given application. The package substrate 110 comprises a recessed cavity 112 formed in an upper surface thereof, wherein the interconnect bridge device 120 is disposed within the recessed cavity 122. The package substrate 110 comprises a network of package traces 114 which vertically and horizontally extend through the package substrate 110, and an area array of solder ball interconnects 116 (e.g., Ball Grid Array (BGA) solder interconnects) disposed on a bottom side of the package substrate 110.

The first chip package 130 comprises a first IC chip 132 and a first RDL structure 134. The first IC chip 132 is flip-chip connected to the first RDL structure 134 using an array of solder bump interconnects 136, with a layer of underfill material 137 disposed therebetween. The first IC chip 132 is encapsulated in a mold 138. The second chip package 140 comprises a second IC chip 142 and a second RDL structure 144. The second IC chip 142 is flip-chip connected to the second RDL structure 144 using an array of solder bump interconnects 146, with a layer of underfill material 147 disposed therebetween. The second IC chip 142 is encapsulated in a mold 148. The layers of underfill material 137 and 147 comprise an electrically-insulating adhesive material which is utilized to maintain the structural integrity of the flip-chip connections between the IC chips 132 and 142 and the respective RDL structures 134 and 144.

The first chip package 130 and the second chip package 140 are connected to (i) the upper surface of the package substrate 110 using solder bump interconnects 150, and (ii) an upper surface of the interconnect bridge device 120 using micro-bump interconnects 152. A layer of underfill material 154 is disposed between the upper surface of the package substrate 110 and the bottom surfaces of the first and second chip packages 130 and 140. The underfill material 154 is also disposed in spaces between the interconnect bridge device 120 and sidewall and bottom surfaces of recessed cavity 112. The underfill material 154 comprises an electrically-insulating adhesive material which is utilized to maintain the structural integrity of the solder bump connections 150 and 152, and to bond the interconnect bridge device 120 within the recessed cavity 112. In some embodiments, the underfill material 154 may comprise different layers of adhesive material, wherein a first layer of underfill material is used in region of the interconnect bridge device 120 to fixedly bond the interconnect bridge device 120 within the recessed cavity 112, and wherein an additional layer of underfill material is used to encapsulate the solder bumps interconnections 150 and 152.

The interconnect bridge device 120 comprises fine-pitch wiring 122 connected to the micro-bumps 152 to provide high-density, high bandwidth I/O connectivity between the first and second chip packages 130 and 140. In some embodiments, the fine-pitch wiring 122 of the interconnect bridge device 120 is formed with sub-micron line-width and line-spacing design rules using bridge fabrication techniques discussed in further detail below. Furthermore, in some embodiments, the interconnect bridge device 120 comprises lateral distribution traces to provide power and ground connections between the first and second chip packages 130 and 140. In some embodiments, the RDL structures 134 and 144 are constructed using thin film technology to build a stack of fine-pitch and/or coarse pitch organic redistribution layers.

In some embodiments, the flip-chip bump connections 152 comprise micro-bumps to enable high density I/O signal communication between the adjacent IC chips 132 and 142 in the first and second chip packages 130 and 140, wherein the flip-chip micro-bump connections 152 are formed with a contact pitch of about 55 microns or less, depending on the application. In some embodiments, the flip-chip solder bump connections 136, 146, and 150 are coarser in pitch than the flip-chip micro-bump connections 152. For example, in some embodiments, the solder bump connections 136, 146, and 150 formed with a contact pitch of about 75 microns or greater, depending on the application. In other embodiments, the solder bumps 146 of the second chip 142 can be micro-bumps (e.g., 55 um or less), and the first chips chip 132 could have mixed pitch solder bumps 136 with some bumps 136 having a pitch of 100 um or greater, while other bumps 136 in the region near the interconnect bridge 120 have a fine pitch of 55 um or less. In other embodiments, both of the IC chips 132 and 142 can have mixed pitch solder bumps. In other embodiments, all of the solder bumps 136, 146, and 152 can have a fine pitch (e.g., 55 um or less), while the solder bumps 150 have a coarser pitch.

In other embodiments, the solder bump connections 136, 146, and/or 150 comprise fine-pitch micro-bump connections. The solder ball connections 116 (e.g., BGA) on the bottom side of the package substrate 110 are formed with a contact pitch of about 100 microns or greater, depending on the application.

While the flip-chip bump connections 136, 146, 150 and 152 are generically illustrated in FIG. 1 for ease of illustration, it is to be understood that the flip-chip bump connections 136, 146, 150 and 152 can be implemented using any suitable flip-chip bump technology. For example, the flip-chip bump connections 136, 146, 150 and 152 can be implemented using controlled collapse chip connection (C4) flip-chip bump technology where solder balls are formed on ball limiting metallurgy (BLM) pads or under bump metallization (UBM) pads. The solder balls can be formed by solder paste printing or electroplating. In other embodiments, the flip-chip bump connections 136, 146, 150 and 152 can be chip connection (C2) bumps comprising metallic pillar structures (e.g. copper pillars) that are formed on metal pads. The metallic pillar bump structures may or may not have solder endcaps. In other embodiments, the flip-chip bump connections 136, 146, 150 and 152 can be C2 bumps with plated metal formed on UBM pads.

In other embodiments, solder micro-bumps comprising Cu and Sn can be electroplated on UBM pads, wherein the UBM pads comprise electroless plated nickel and immersion gold. The joining of the two flip-chip elements can be performed by joining CuSn solder micro bumps on one flip-chip element to UBM pads on another flip-chip element, or by joining CuSn solder micro bumps on one flip-chip element to CuSn solder micro bumps on another flip-chip element. In other embodiments, an area array of copper pillar bumps on one flip-chip element can be bonded to an area array of solder balls on another flip-chip element. In addition, an area array of high-temperature solder bumps formed on UBM pads on one flip-chip element can be joined to an area array of low temperature solder bumps formed on contact pads of another flip-chip element.

For a heterogeneous packaging application, the IC chips 132 and 142 may comprise any type of integrated circuit and system to implement a given application. For illustrative purposes, the exemplary package structure 100 of FIG. 1 show two IC chips, wherein the first IC chip 132 comprises a hardware accelerator device, and the second IC chip 142 comprises a high-bandwidth memory (HBM) dynamic random-access memory (DRAM) device. In other embodiments, the IC chips 132 and 142 (and other additional IC dies) may comprise one or more of a memory device, a central processing unit (CPU), a microcontroller, an application-specific integrated circuit (ASIC), a field programmable gate array (FPGA), and other types of general purposes processors or work-load optimized processors such as graphics processing units (GPUs), digital signal processors (DSPs), system-on-chip (SoC), and other types of specialized processors or coprocessors that are configured to execute one or more fixed functions.

In some embodiments, a footprint of a given chip package (e.g., chip package 140) can be designed to substantially or completely overlap the interconnect bridge device 120 such that all input/output, power/ground, and other connections between the given chip package is routed through the interconnect bridge device 120. Indeed, in some embodiments, there can be a small IC chip (relative to a large IC chip such as an accelerator (e.g., GPU)) which has a relatively small footprint such that the entire footprint of the chip package (which contains such IC chip and associated RDL structure) is mounted to the interconnect bridge device 120. In this instance, the interconnect bridge device 120 can be irregularly shaped (e.g., non-rectangular) in order to accommodate both the smaller and larger chip packages that are attached to the interconnect bridge device 120.

Figure 2:
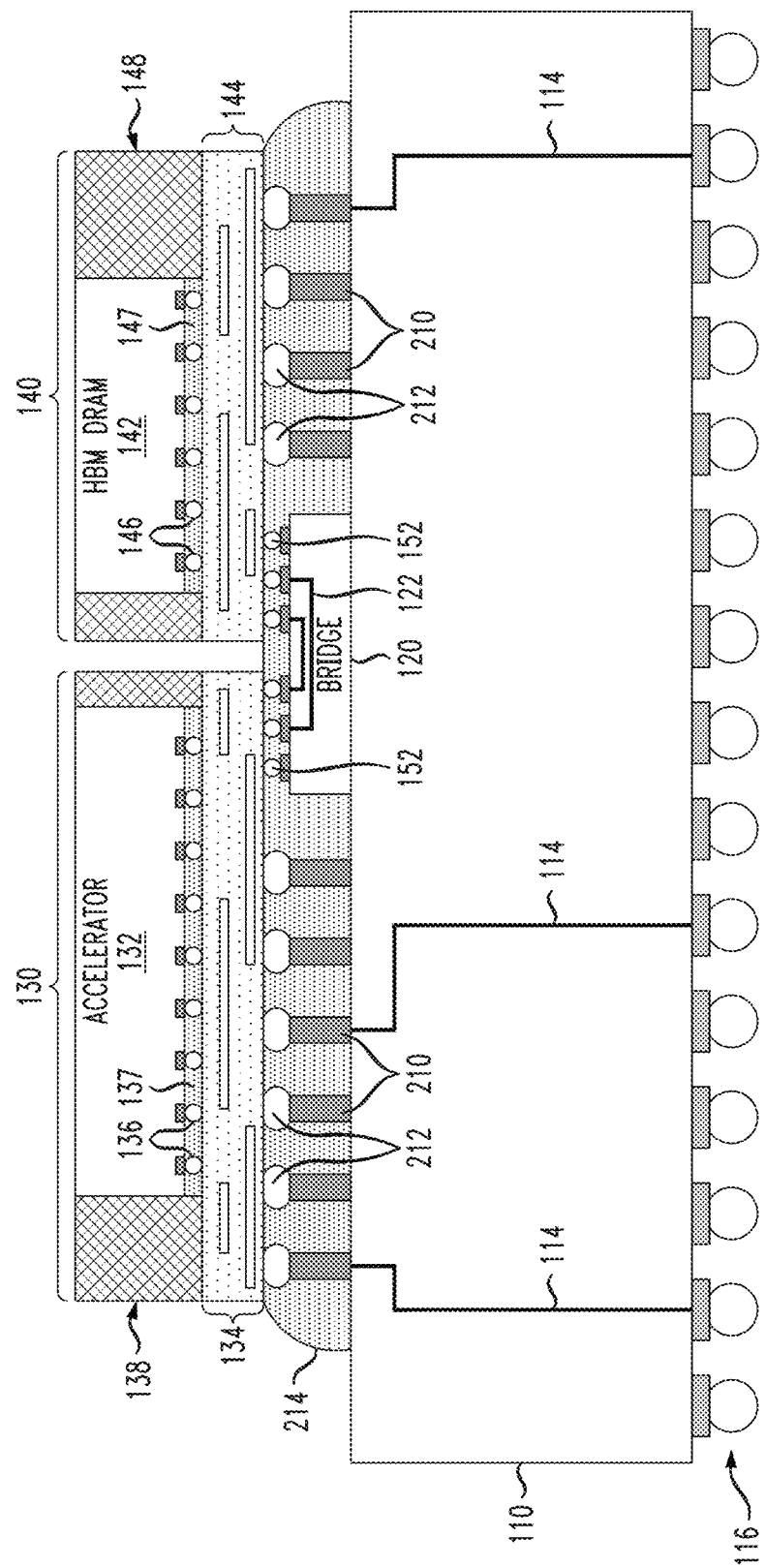
FIG. 2 schematically illustrates a multi-chip package structure according to another embodiment of the disclosure.

FIG. 2 schematically illustrates a multi-chip package structure 200 according to another embodiment of the disclosure. The multi-chip package structure 200 is similar to the multi-chip package structure 100 of FIG. 1, except that the interconnect bridge device 120 is disposed on the top-side of the package substrate 110, as compared to being disposed and mounted within a recessed cavity (e.g., cavity 112, FIG. 1) of the package substrate 110. In addition, in the exemplary embodiment of FIG. 2, the interconnects between the package substrate 110 and the first and second chip packages 130 and 130 comprise standoff structures 210 and solder bumps 212. In some embodiments, the stand-off structures 210 are formed on the top-side of the package substrate 110 to offset the height of the interconnect bridge device 120.

In some embodiments, the standoff structures 210 comprise solder-coated copper balls that are disposed on area array contact pads formed on the top-side of the package substrate 110. In another embodiment, the standoff structures 210 may comprise copper pillars, or copper pillars with solder end caps, or other types of standoff structures which are suitable for the given application. In some embodiments, the first and second chip packages 130 and 140 are formed with solder bumps on the bottom sides of the RDL structures 134 and 144, which bond with solder caps formed on top of the standoff structures 210 during the assembly process.

In other embodiments, stand-off structures (e.g., tall pillars) cam be formed on bottom surfaces of the chip package 130 and 140 instead of on the surface of the package substrate 110. In other embodiments, tall connection structures can be formed on both the upper surface of the package substrate 110 and on the bottom surfaces of the chip packages 130 and 140, with or without solder caps, wherein the connection structures when combined would offset the height of the interconnect bridge device 120. In other embodiments, the interconnect bridge device 120 can be disposed within a cavity of a solder mask that is formed on the surface of the substrate 110. In other embodiments, the interconnect bridge device 110 can be partially recessed within a shallow cavity formed in the surface of the package substrate 110.

Figure 3:
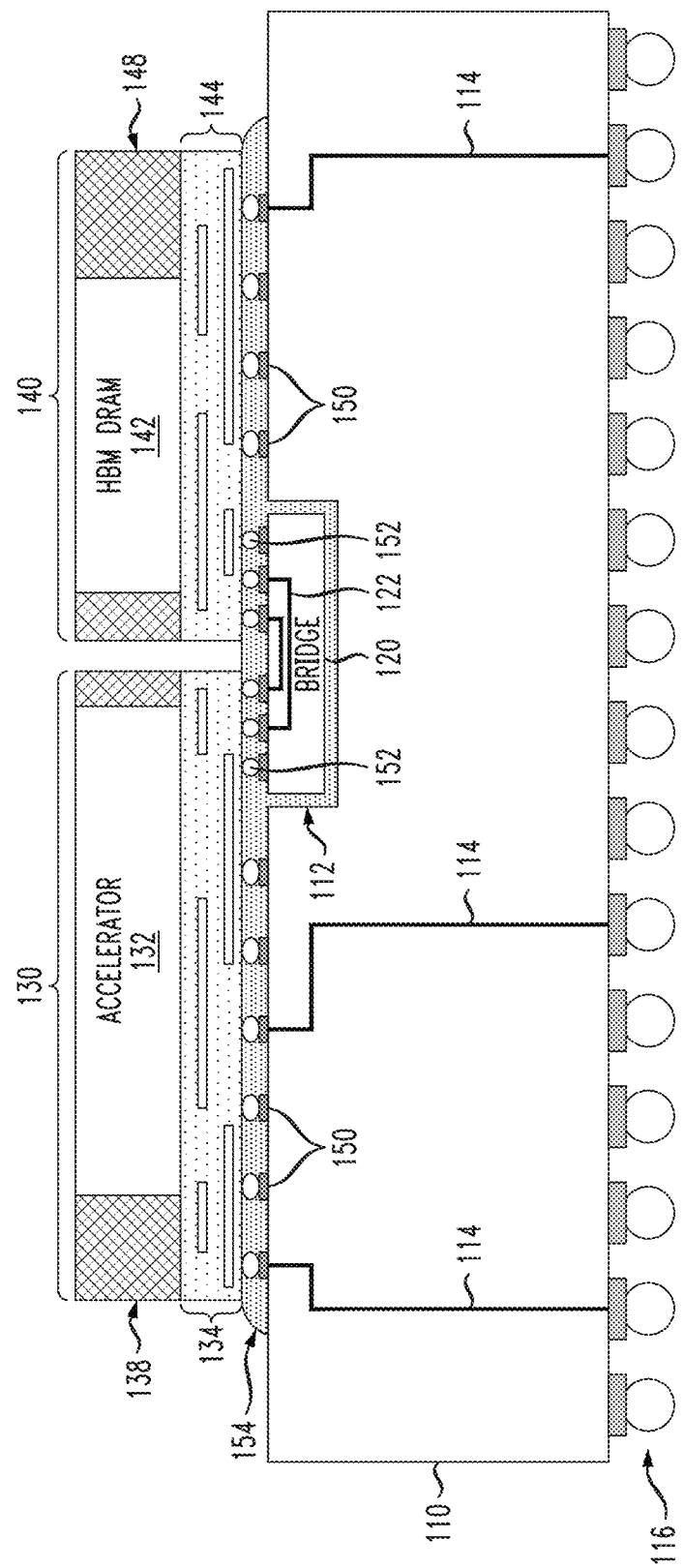
FIG. 3 schematically illustrates a multi-chip package structure according to another embodiment of the disclosure.

FIG. 3 schematically illustrates a multi-chip package structure 300 according to another embodiment of the disclosure. The multi-chip package structure 300 is similar to the multi-chip package structure 100 of FIG. 1, except that first and chip package structures 130 and 140 eliminate the solder bump interconnects 136 and 146 between the IC chips 132 and 142 and the corresponding RDL structures 134 and 144. Instead, the RDL structures 134 and 144 are formed on the active surfaces of the IC chips 132 and 143 using a process flow as discussed in further detail below.

Figure 4:
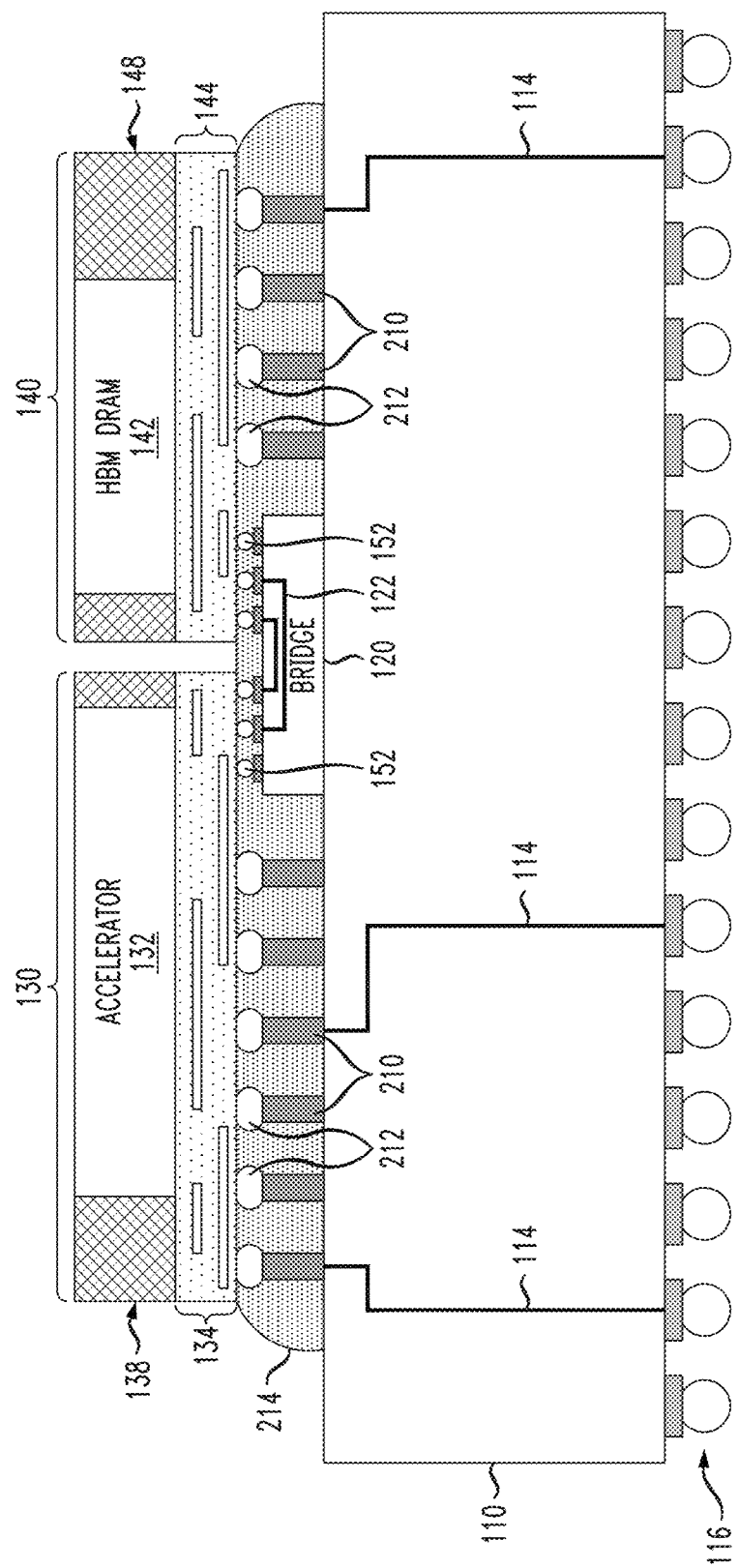
FIG. 4 schematically illustrates a multi-chip package structure according to another embodiment of the disclosure.

Similarly, FIG. 4 schematically illustrates a multi-chip package structure 400 according to another embodiment of the disclosure. The multi-chip package structure 400 is similar to the multi-chip package structure 200 of FIG. 2, except that first and chip package structures 130 and 140 eliminate the solder bump interconnects 136 and 146 between the IC chips 132 and 142 and the corresponding RDL structures 134 and 144. Instead, the RDL structures 134 and 144 are formed on the active surfaces of the IC chips 132 and 143 using a process flow as discussed in further detail below.

Figure 5:
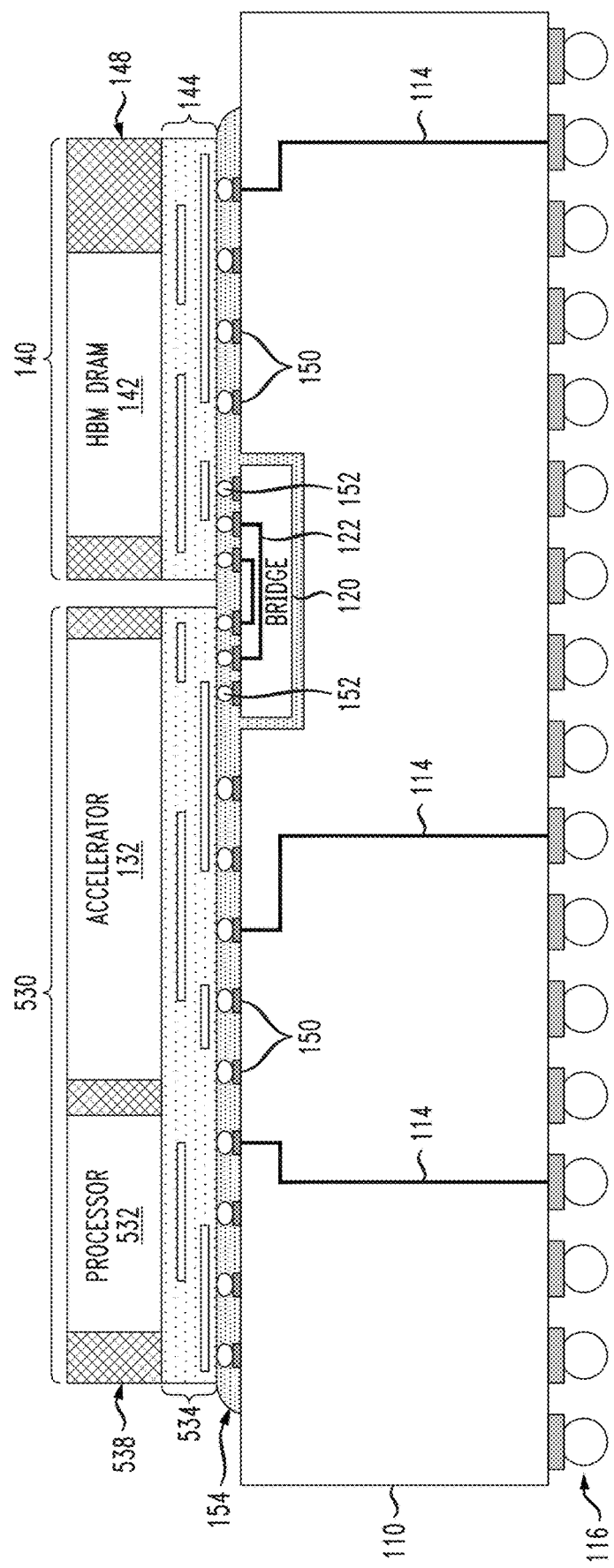
FIG. 5 schematically illustrates a multi-chip package structure according to another embodiment of the disclosure.

FIG. 5 schematically illustrates a multi-chip package structure 500 according to another embodiment of the disclosure. The multi-chip package structure 500 is similar to the multi-chip package structure 300 of FIG. 3, except that FIG. 5 illustrates an exemplary embodiment in which a chip package 530 comprises multiple IC chips 532 and 132 that are commonly connected to an RDL structure 534. In this embodiment, the first and second IC chips 532 and 132 are disposed within a mold 538, and the RDL structure 534 is formed on the active surfaces of the IC chips 532 and 132. In other embodiments, the IC chips 532 and 132 are connected to the RDL structure 534 using solder bump interconnects. The RDL structure 534 comprises horizontal and vertical wiring to provide (i) connections between the IC chips 532 and 132, (ii) connections between the package substrate 110 and the IC chips 532 and 132, (iii) connections between the IC chip 132 and the interconnect bridge device 120, and (iv) power distribution in an overlap region of the RDL structure 534 between the IC chip 132 and the interconnect bridge device 120, where the interconnect bridge device 120 blocks vertical power distribution from the package substrate 110 to an IO region of the IC chip 132.

In an alternate embodiment of the multi-chip package structures discussed above, a multi-chip package structure could be formed to include an interconnect bridge device that is joined to both (i) a chip package having one or more IC chips connected to a discrete RDL structure and (ii) at least one individual IC chip without an RDL structure. In this embodiment, the individual chip would be flip-chip bonded directly to the interconnect bridge device and to the surface of the package substrate. In addition, the individual chip can be connected to another individual chip or another chip package (with an RDL structure) using a second interconnect bridge device.

There are various advantages to utilizing fabrication and assembly methods as discussed herein for constructing multi-chip package structures as shown in FIGS. 1-5. For example, in the exemplary embodiments of FIGS. 1, 2, 3, 4, and 5, the discrete RDL structures enable power distribution and fan-out for commodity dies to be used with interconnect bridge devices. The RDL structures are configured to distribute power to regions between the IC chips and the interconnect bridge. In some embodiments, the RDL structures can be configured to fan-out micro-bumps that are formed on the active surfaces of the IC dies to thereby change the spacing between bump regions and to transform the pitch of the micro-bumps to more relaxed pitch bumps for joining to the package substrates, while providing the fine contact pitches that are needed for joining the chip package structures to the interconnect bridges using micro-bumps. Furthermore, the use of chip package structures comprising one or several IC chips joined to a discrete RDL structure eliminates the problems of warpage and low yield in conventional methods in which a relatively large number of chips (e.g., 4 or more) for a given application are mounted to a single, large fan-out RDL structure.

Various methods for fabricating the multi-chip package structures comprising interconnect bridge devices and chip packages, such as shown in FIGS. 1, 2, 3, 4, and 5, will now be discussed in further detail with reference to FIGS. 6A-6G, and FIGS. 7A-7D. In general, exemplary fabrication methods according to embodiments of the disclosure comprise "RDL first" techniques in which a wafer-level or panel level RDL structure is first formed on a temporary carrier, and IC chips are flip-chip connected to the wafer-level RDL structure using solder bump connections. Such "RDL first" techniques are utilized to fabricate the chip package structures 130 and 140 as shown in FIGS. 1 and 2. In addition, exemplary fabrication methods according to embodiments of the disclosure include "RDL last" techniques in which multiple IC chips are first encapsulated in mold, and a wafer-level RDL structure is directly formed on the active surfaces of the multiple IC chips. Such "RDL last" techniques are utilized to fabricate the chip package structures 130, 140, 530 shown in FIGS. 3, 4 and 5.

Furthermore, the multi-chip package structures such as shown in FIGS. 1-5 can be constructed using one of a plurality of direct bonded heterogeneous integration (DBHi) assembly techniques. For example, in some embodiments, a "chip-first" DBHi package assembly process is implemented in which an interconnect bridge device is bonded to multiple chip packages, and then the assembly of the interconnect bridge device and IC chip packages is bonded to a package substrate. In other embodiments, a multi-chip package structure is constructed using a "bridge first" DBHi package assembly process in which an interconnect bridge device is temporarily connected to a handler substrate, chuck or fixture, and then two or more chip packages are bonded to a front side of the interconnect bridge, and then the assembly of the interconnect bridge device and the IC chip packages is bonded to a package substrate. In other embodiments, a multi-chip package structure is constructed using a "substrate first" DBHi package assembly process in which an interconnect bridge device is bonded to a package substrate (either on an upper planar surface of the substrate or within a recessed cavity formed in the upper surface of the substrate), and then two or more chip packages are flip-chip mounted to the assembly of the interconnect bridge and the package substrate.

Figure 6A:

FIGS. 6A-6G schematically illustrate a process for fabricating a multi-chip package structure according to an embodiment of the disclosure. More specifically, FIGS. 6A-6G schematically illustrate a process for fabricating a multi-chip package structure using a "RDL first" process to form chip packages, followed by a "chip first" DBHi assembly process to assemble the chip packages to an interconnect bridge device and a package substrate. To begin, FIG. 6A is a schematic cross-sectional side view of a package structure at an intermediate stage of fabrication in which a wafer-level RDL structures 610 is formed over a surface of a temporary carrier substrate 600. In some embodiments, the temporary carrier substrate 600 comprises a semiconductor wafer (e.g., silicon wafer) or a glass wafer. The wafer-level RDL structures 610 comprises a stack of RDL layers including a first insulating layer 620, a second insulating layer 630, and a third insulating layer 640, wherein each layer comprises respective metallization structures 622, 632, and 642. The metallization structures 622, 632, and 642 comprise horizontal wiring, vertical vias, contact pads, etc. Although not shown in FIG. 6A, one or more sacrificial layers or release layers may be disposed between the carrier substrate 600 and the wafer-level RDL structure 610 to facilitate removal of the temporary carrier substrate 600 at a subsequent stage in the fabrication process.

In some embodiments, the RDL insulating layers 620, 630, and 640 comprise organic laminate layers that are formed using standard organic laminate build-up layers in which the insulating layer are formed of an organic material (e.g. polyimide, FR4, etc.) or any suitable dielectric or polymer material which is typically used to form wafer-level RDL fan-out and fan-in structures. The insulating layers 620, 630, and 640 are sequentially deposited and patterned to form openings that are filled with metallic material (e.g., copper) to form the metallization structures 622, 632, and 642. The use of organic build-up layers facilitates the fabrication of thick wiring and interconnects for the purpose of power distribution through the RDL layers of the RDL of the package structure. In other embodiments, RDL structure 610 can be fabricated using fine-pitch organic redistribution layers to provide greater wiring density for I/O redistribution as needed. In other embodiments, the RDL layers of the RDL structure 610 can be fabricated using standard BEOL fabrication methods, with more relaxed design rules than the BEOL processes that are used, for example, to fabricate an interconnection bridge device. While the exemplary embodiment of FIG. 6A illustrates a wafer-level RDL structure 610 comprising three redistribution layers, in other embodiments, the RDL structure 610 can include two or more redistribution layers, depending on the given application.

Figure 6B:
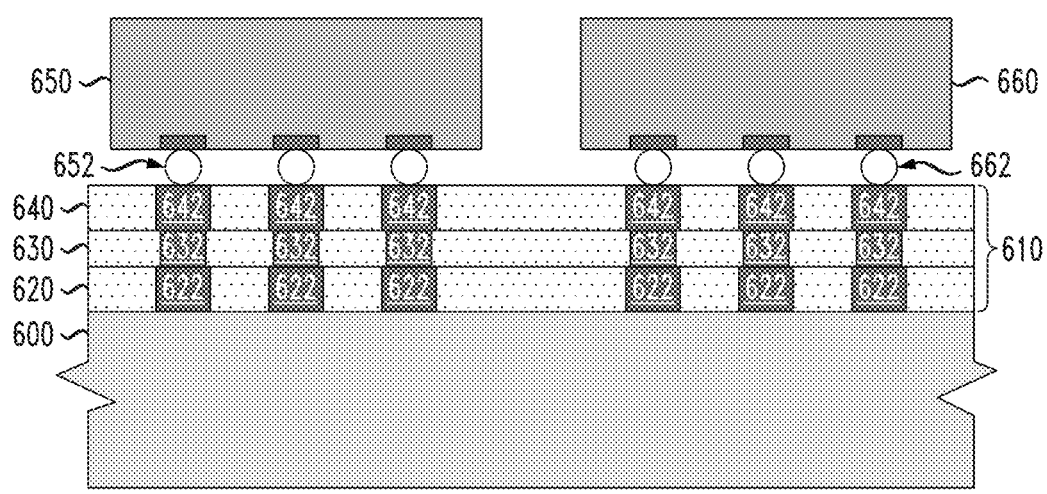

Next, FIG. 6B is a schematic cross-sectional side view of the package structure of FIG. 6A after flip-chip bonding a plurality of IC chips 650 and 660 to the RDL structure 610. The IC chips 650 and 660 are attached to the RDL structure 610 using respective solder bump connections 652 and 662. The first and second IC chips 650 and 660 can be flip-chip bonded to the upper redistribution layer 140 using solder reflow or thermo-compression bonding techniques. In some embodiments, the first and second IC chips 650 and 660 are the same type of IC chip (e.g., identical dies) that are formed on a wafer and diced to separate the dies. In this instance, the RDL structure 610 comprises a same pattern of RDL wiring for each of the IC chips 650 and 660. In other embodiments, the first and second IC chips 650 and 660 are different types of IC chips (e.g., different dies) that are formed on the same wafer or different wafers, and diced to separate the dies. In this instance, the RDL structure 610 comprises different patterns of RDL wiring for the IC chips 650 and 660. The RDL structure 610 can be constructed to provide fan-out wiring or fan-in wiring for the IC chips 650 and 660, depending on the application.

Figure 6C:
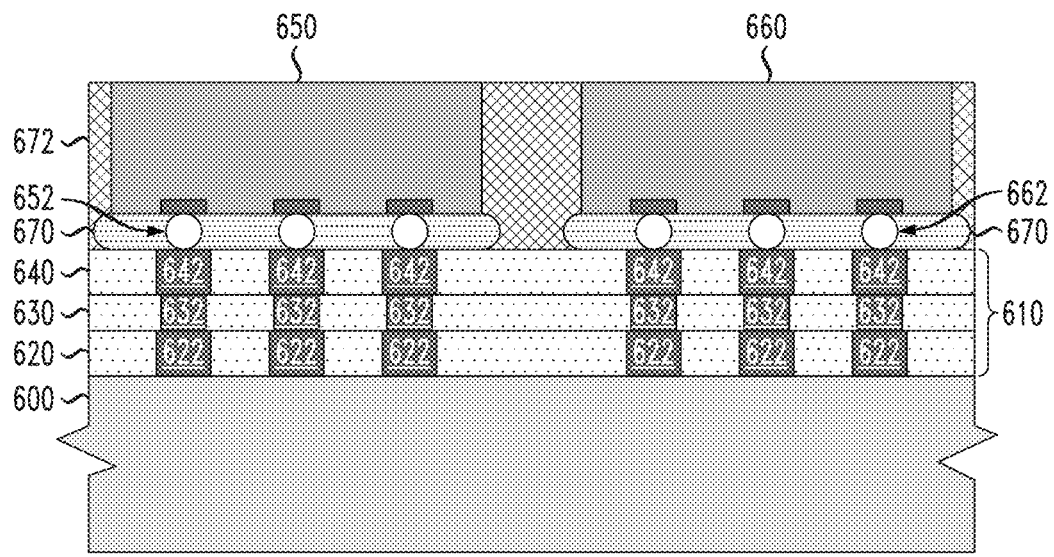

Next, FIG. 6C is a schematic cross-sectional side view of the package structure of FIG. 6B after forming layers of underfill material 670 between the active surfaces of the IC chips 650 and 660 and the upper surface of the RDL structure 610 and after forming a molding layer 672 to encapsulate the IC chips 650 and 660. The layers of underfill material 670 comprise an electrically-insulating adhesive material which is utilized to maintain the structural integrity of the flip-chip connections 652 and 662 between the IC chips 650 and 660 and the upper surface of the RDL structure 610. In some embodiments, the underfill layers 670 are formed following flip-chip bonding of the first and second IC chips 650 and 660 using a capillary underfill process to deposit a liquified underfill material between the IC chips 650 and 660 and the upper surface of the RDL structure 610, followed by a cure process to harden the underfill material. In other embodiments, the underfill layers 670 may comprise pre-applied underfill layers that are applied on the upper surface of the RDL structure 610 or on the bumped surfaces of the IC chips 650 and 660 prior to the flip-chip bonding process. In some embodiments, the material of the underfill layer 670 for the first IC chip 650 can be different from the material of the underfill layer 670 for the second IC chip 660, depending on packaging requirements. Following formation of the underfill layers 670, a molding process is performed to form the molding layer 672, which encapsulates the first and second IC chips 650 and 660 and covers the exposed portions of the upper surface of the RDL structure 610.

Figure 6D:
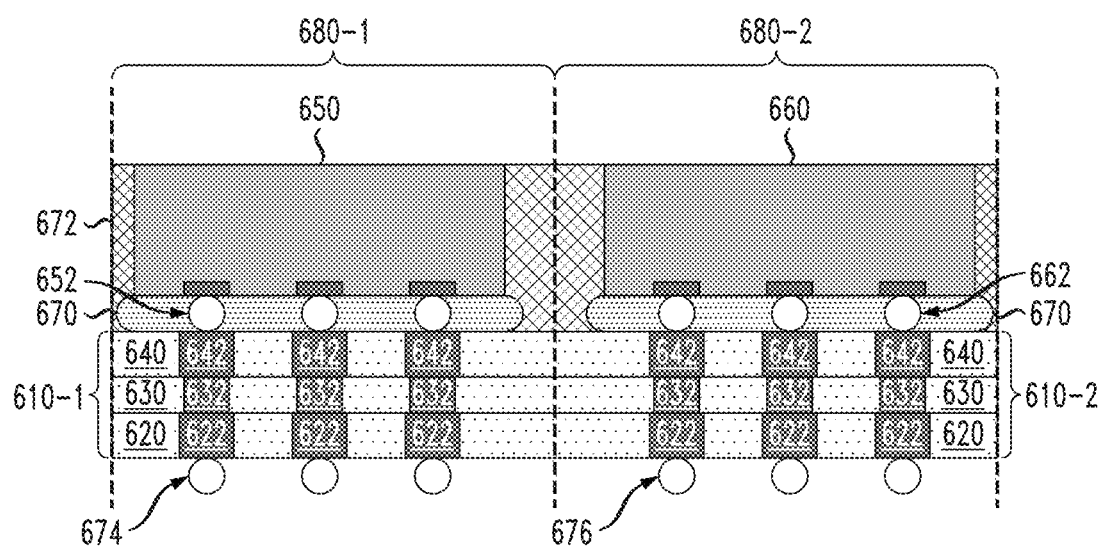

Next, FIG. 6D is a schematic cross-sectional side view of the package structure of FIG. 6C after removing the temporary carrier substrate 600 from the bottom surface of the RDL structure 610 and forming arrays of solder bumps 674 and 676 on the bottom surface of the RDL structure 610. The carrier substrate 600 is removed using known techniques. For example, when a releasable adhesive layer is disposed between the carrier substrate 600 and the bottom layer of the RDL structure 610, the carrier substrate 600 can be removed by ablating or vaporizing the adhesive layer using, e.g. IR laser ablation or UV ablation, to release the carrier substrate 600. In other embodiments, when the carrier substrate 600 comprises a silicon substrate on which the RDL structures 610 is formed, the carrier substrate 600 can be removed using any suitable mechanical debonding process to expose the bottom surface of the RDL structure 610.

For ease of illustration, the solder bumps 674 and 676 are generically depicted in FIG. 6D. However, it is to be understood that each array of solder bumps 674 and 676 can include mixed-pitch bumps, including fine-pitch bumps for connection to an interconnect bridge device using micro-solder bumps, and coarser pitch bumps for connection to the package substrate. Following formation of the arrays of solder bumps 674 and 676, the intermediate package structure shown in FIG. 6D is diced along the dashed lines to form individual chip packages 680-1 and 680-2 comprising respective IC chips 650 and 660 and respective individual RDL structures 610-1 and 610-2. In some embodiments, when the IC chips 650 and 660 are identical dies, the chip packages 680-1 and 680-2 can have substantially identical structures (e.g., individual RDL structures 610-1 and 610-2 are the same, and the arrays of solder bumps 674 and 676 are the same). In other embodiments, when the IC chips 650 and 660 are different, the chip packages 680-1- and 680-2 will be different in structural configuration. For illustrative purposes, in the following description, it is assumed that the chip packages 680-1 and 680-2 are different chip packages.

Figure 6E:
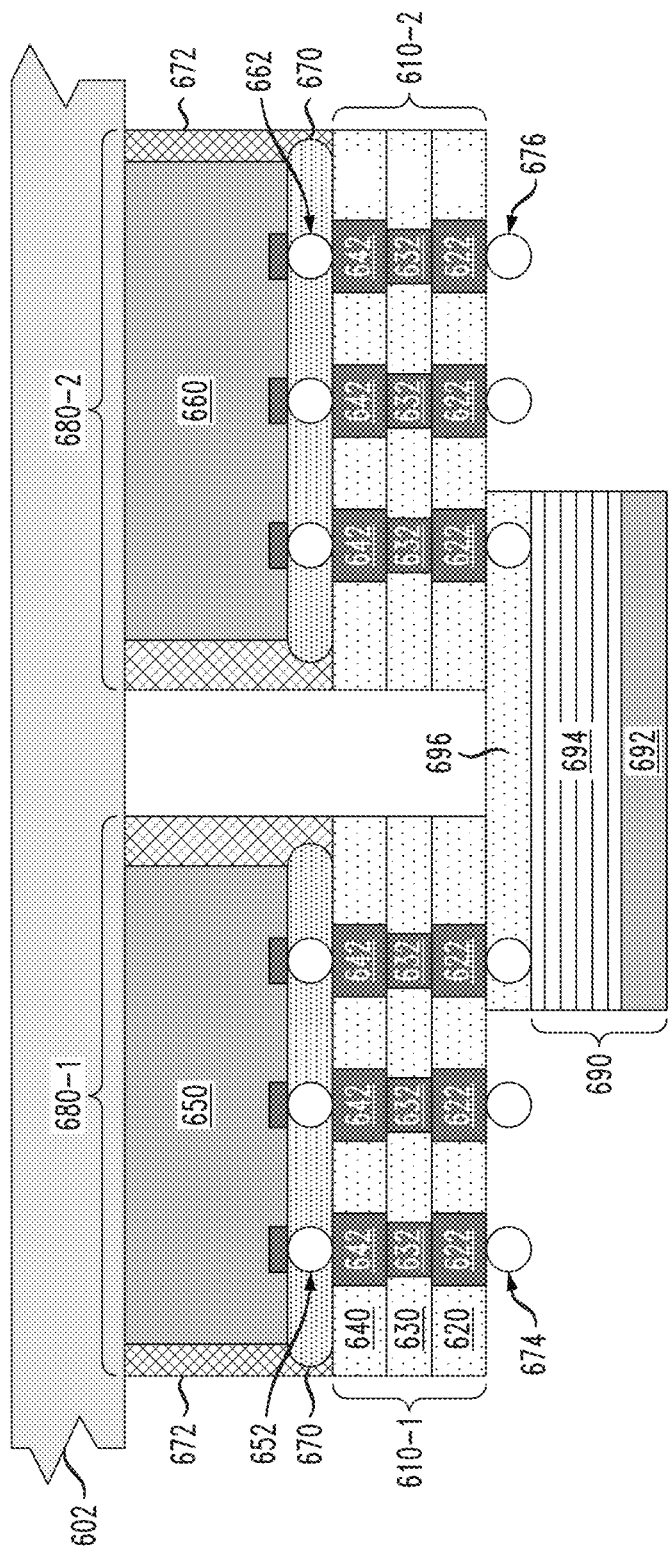

Next, FIG. 6E is a schematic cross-sectional side view of the intermediate package structure of FIG. 6D after bonding an interconnect bridge device 690 to the first and second chip packages 680-1 and 680-2. FIG. 6E illustrates an initial stage of an exemplary "chip first" DBHi assembly process in which the chip packages 680-1 and 680-2 are first bonded to a handler substrate 602 using a releasable adhesive layer, and then the interconnect bridge device 690 is connected to the chip packages 680-1 and 690-2 using micro-bumps that included within the arrays of solder bumps 674 and 676 on the bottom surfaces of the individual RDL structures 610-1 and 610-2.

As generically illustrated in FIG. 6E, the interconnect bridge device 690 comprises a substrate 692 and an interconnect structure 694 formed on an upper surface of the substrate 692. The interconnect structure 694 comprises fine-pitch wiring to provide high-density, high bandwidth I/O connectivity between the chip packages 680-1 and 680-2. As further shown in FIG. 6E, an optional pre-applied layer of underfill material 696 may be formed on the upper surface of the interconnect bridge device 690 before bonding the interconnect bridge device 690 to the chip packages 680-1 and 680-2. In some embodiments, the substrate 692 comprises a temporary handler substrate that is utilized during a bridge fabrication process. In some embodiments, the substrate 692 comprises a portion of a wafer substrate (e.g., a silicon or glass wafer substrate) on which the interconnect structure 694 is formed. In some embodiments, the substrate 692 is removed after bonding the interconnection structure 694 of the bridge device 690 to the chip packages 680-1 and 680-2. In other embodiments, if the interconnection structure 694 is relatively thick, it can be removed before joining the IC chips 650 and 660. The substrate 692 is removed in instances where the interconnection structure 694 of the bridge device 690 comprises contact pads on which solder bumps are subsequently formed to bond to corresponding contact pads on the package substrate. In other embodiments, the substrate 692 is not removed such as in instances where no direct connections are to be made between the bottom side of the interconnection structure 694 of the bridge device 690 and the package substrate.

The interconnect bridge device 690 (and other bridge devices illustrated in, e.g., FIGS. 1-5) can be constructed using various types of materials and semiconductor fabrication techniques to obtain target line-width and line-spacing design rules that are suitable for the given application. In some embodiments, the fine-pitch wiring of the interconnect bridge device 690 can be formed with sub-micron line-width and line-spacing design rules using bridge fabrication techniques such as disclosed in commonly owned U.S. patent application Ser. No. 16/043,503, filed on Jul. 24, 2018, entitled "Multi-Chip Package Structure Having Chip Interconnection Bridge Which Provides Power Connections Between Chip and Package Substrate," the disclosure of which is fully incorporated herein by reference.

In general, U.S. patent application Ser. No. 16/043,503 describes methods for fabricating interconnect bridges on a carrier substrate using wafer level fan-out techniques in conjunction with back-end-of-line (BEOL) fabrication methods in which typical BEOL dielectric and metallic materials are utilized to form an interconnect bridge structure comprising multiple layers of wiring and inter-layer vias which provide high density die-to-die interconnect wiring for high-bandwidth I/O communication between multiple IC chips, and possible redistribution layers to route power/ground connections through the chip interconnection bridge structure from bottom-side flip-chip connections with the package substrate to top-side flip-chip connections with the IC chips. For example, in some embodiments, the interconnect bridge device 690 can be fabricated by a process which comprises building a BEOL structure on a first carrier wafer to form a interconnect bridge wafer, wherein the BEOL structure comprises a stack of signal interconnect and redistribution layers comprising fine pitch signal wires and vertical inter-level vias (e.g., copper wiring and vias) that are formed in multiple inter-level dielectric (ILD) layers of dielectric material (e.g., silicon based low-k dielectrics (e.g., k less than about 4.0), porous dielectrics, or other suitable ULK (ultra-low-k) dielectric materials (with k less than about 2.5)). The wafer-level bridge structure is diced to obtain individual interconnect bridge devices.

Figure 6F:
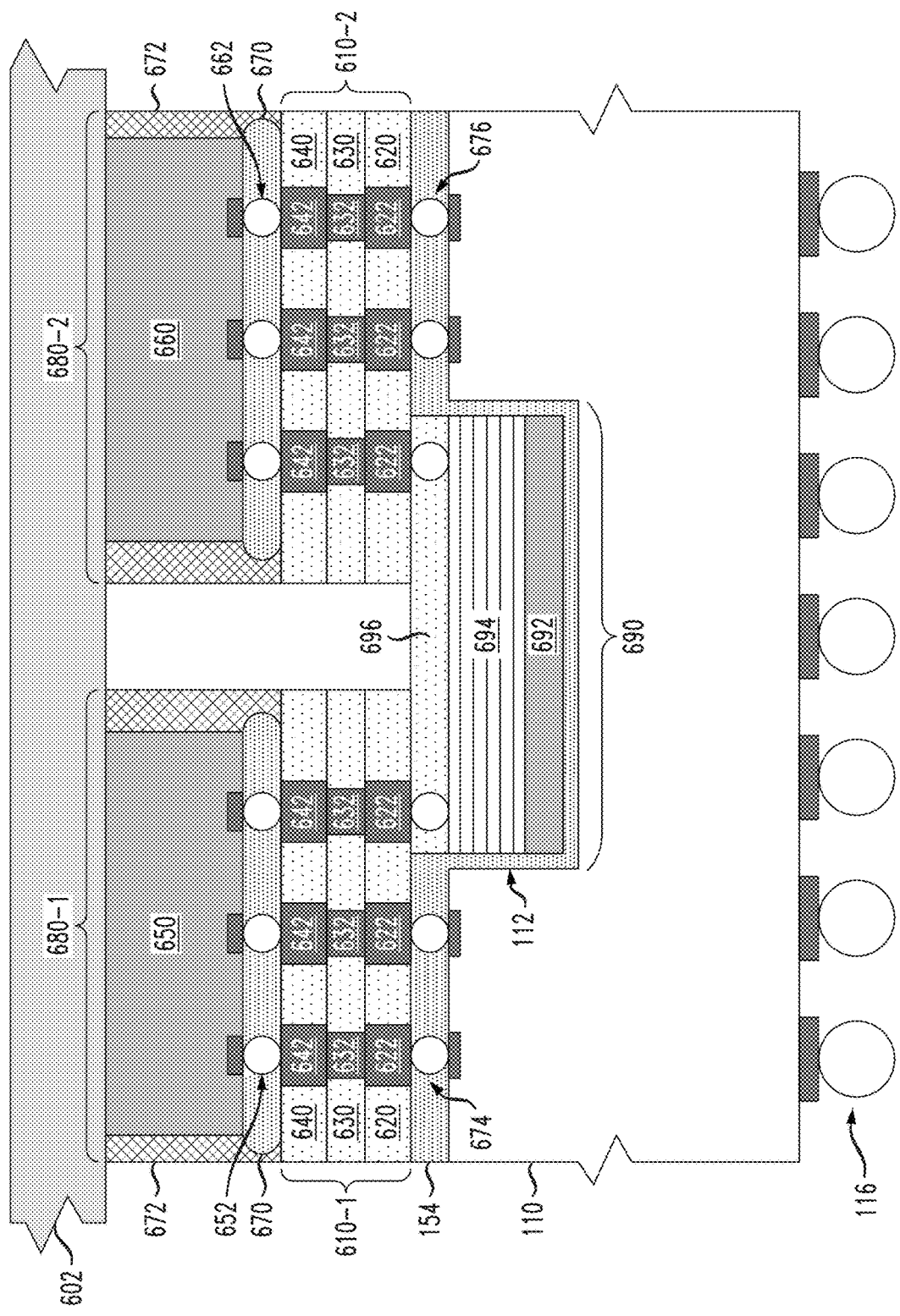

Next, FIG. 6F is a schematic cross-sectional side view of an intermediate package structure that is obtained after connecting the assembly of the IC chip packages 680-1 and 680-2 and the interconnect bridge device 690 of FIG. 6E to a package substrate 110. FIG. 6F illustrates a next stage of the "chip first" DBHi assembly process in which the assembly of FIG. 6E is bonded to the package substrate 110. In this exemplary embodiment, the interconnect bridge device 690 is disposed within the recessed cavity 112 of the package substrate 110. The bonding process is performed by bonding solder bumps connections within the arrays of solder bumps 674 and 676 to bond pads on the upper surface of the package substrate 110 and then performing an underfill process to fill the space between the upper surface of the package substrate 110 and the bottoms surfaces of the chip packages 680-1 and 680-2 with underfill material 154. The underfill material 154 flows into the recessed cavity to facilitate bonding of the interconnect bridge device 690 within the recessed cavity 112. In other embodiments, as mentioned above, the underfill material 154 may comprise different layers of adhesive material, wherein a first layer of underfill material is used in region of the interconnect bridge device 690 to fixedly bond the interconnect bridge device 690 within the recessed cavity 112, and wherein an additional layer of underfill material is used to encapsulate the solder bumps connections 674 and 676.

Figure 6G:
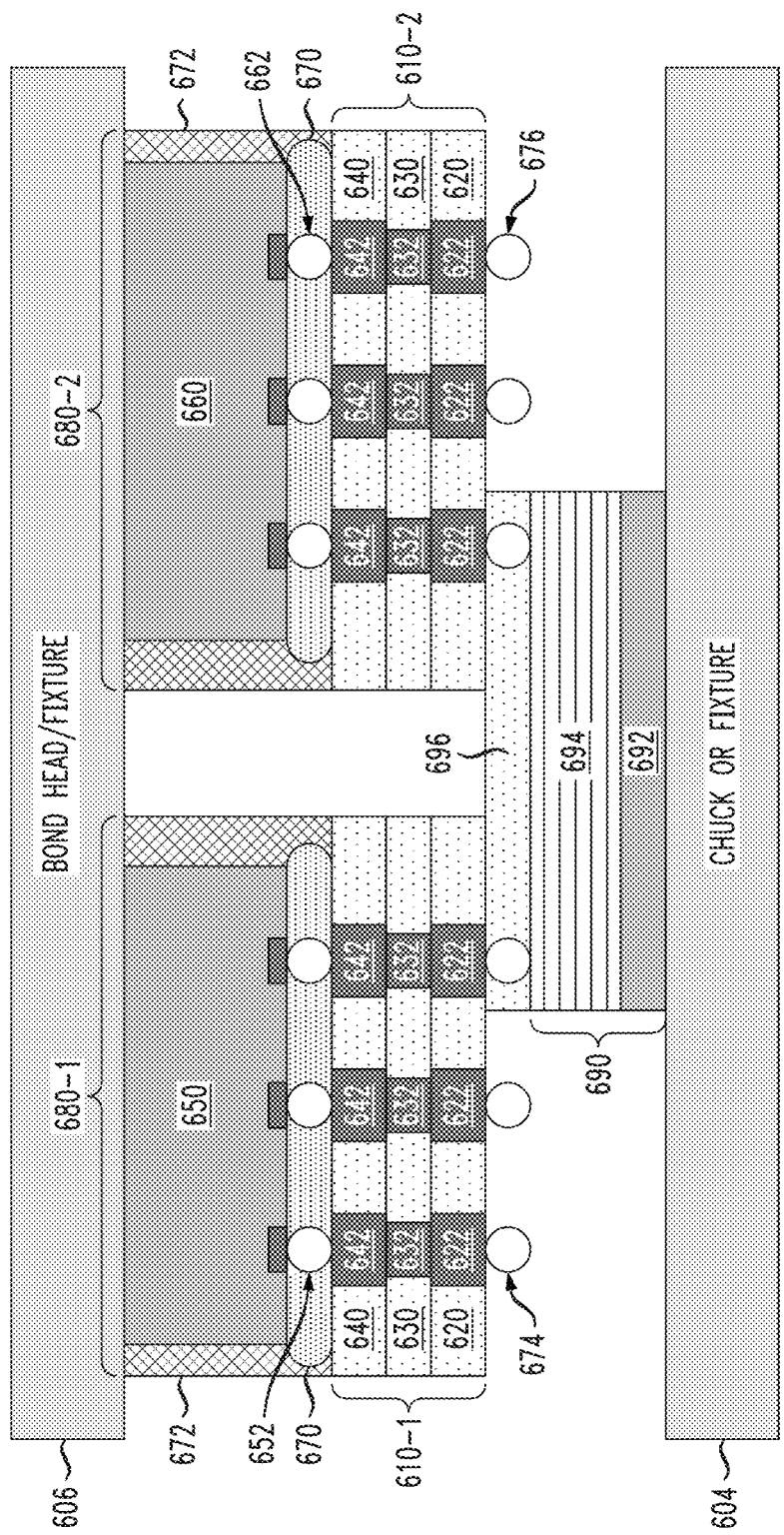

It is to be understood that the exemplary "chip first" DBHi assembly scheme could be used to bond the assembly of FIG. 6F to a planar upper surface of the laminate package substrate 100 with no recessed cavity to obtain a package structure such as shown in FIG. 2. In other embodiments, the intermediate package structure shown in FIG. 6F can be assembled using a "bridge first" DBHi assembly process, as schematically illustrated in FIG. 6G. In particular, FIG. 6G illustrates an initial stage of a bridge first" DBHi assembly process in which the interconnect bridge device 690 is fixedly placed on a chuck or fixture 604 of a bonding machine, the chip package structures 680-1 and 680-2 are sequentially joined to the interconnect bridge device 690, and a bond head/fixture 606 is connected to the back side surfaces of the chip package structures 680-1 and 680-2. In this process, interconnect bridge device 690 is release, and the bond head/fixture 606 is utilized to place the assembly comprising the chip packages 680-1 and 680-2 and interconnect bridge device 60 in proper position on a top side of the package substrate and then bond the assembly to the package substrate using known techniques. In other embodiments, in a "package first" DBHi assembly process, the interconnect bridge device 690 would be bonded to the package substrate 110 (on the planar top surface or in a recessed cavity), and then the chip packages 680-1 and 680-2 would be sequentially joined to the interconnect bridge device 690 and package substrate 110.

Figure 7A:
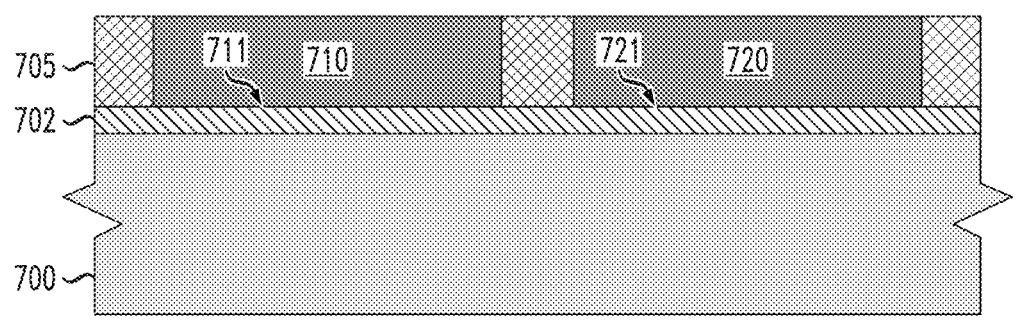

FIGS. 7A, 7B, 7C, and 7D schematically illustrate a process for fabricating a multi-chip package structure according to another embodiment of the disclosure. More specifically, FIGS. 7A-7D schematically illustrate a process for fabricating a multi-chip package structure using a "chip first" process to form chip package structures. To begin, FIG. 7A is a schematic cross-sectional side view of a chip package structure at an intermediate stage of fabrication in which a plurality of IC chips are mounted to a carrier substrate. In particular, FIG. 7A illustrates a carrier substrate 700 comprising an adhesive layer 702 (or multiple layers, if required) disposed on a surface of the carrier substrate 700, a first IC chip 710 and a second IC chip 720 bonded face down to the carrier substrate 700 using the adhesive layer 702, and a molding layer 705 encapsulating the first and second IC chips 710 and 720. In some embodiments, the adhesive layer 702 comprises a thermal release tape. The first and second IC chips 710 and 720 have active surfaces 711 and 721, respectively, which are temporarily bonded to the carrier wafer 700. In some embodiments, the first and second chips 710 and 720 are identical IC dies (e.g., the same accelerator or memory chip). In other embodiments, the first and second chips are different types of IC dies.

Figure 7B:
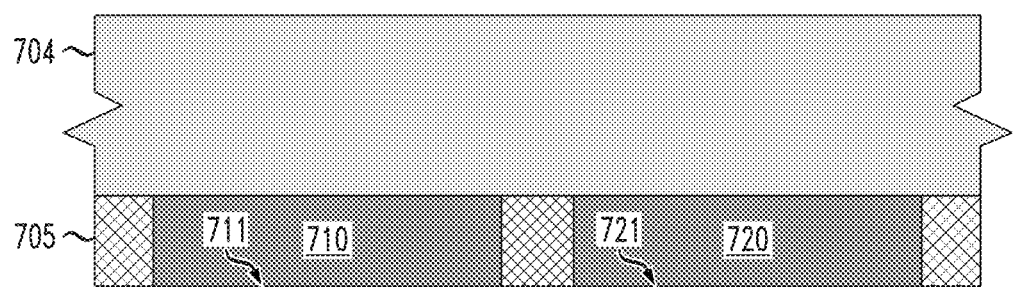

Next, FIG. 7B is a schematic cross-sectional side view of the intermediate package structure of FIG. 7A after removing the carrier substrate 700 to expose the active surfaces 711 and 712 of the first and second IC chips 710 and 720, and after bonding a handler substrate 704 to the backside surfaces of the IC chips 710 and 720 and the molding layer 705 using, for example, a releasable adhesive layer.

Figure 7C:
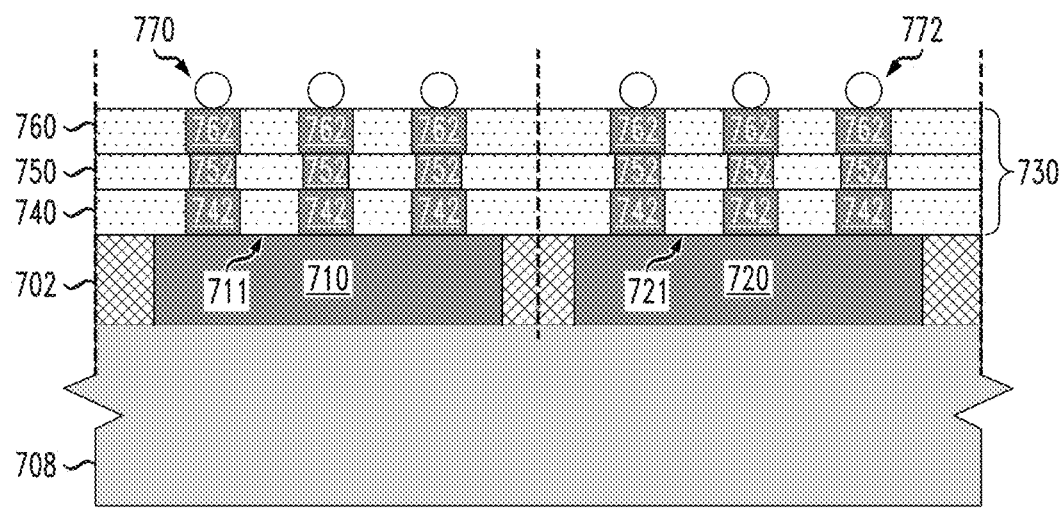

Next, FIG. 7C is a schematic cross-sectional side view of the intermediate package structure of FIG. 7B after forming a wafer-level RDL structure 730 over the active surfaces 711 and 721 of the first and second IC chips 710 and 720, and after forming solder bumps on the RDL structure 730. The wafer-level RDL structure 702 comprises a stack of RDL layers including a first insulating layer 740, a second insulating layer 750, and a third insulating layer 760, wherein each layer comprises respective metallization structures 742, 752, and 762. The metallization structures 742, 752, and 762 comprise horizontal wiring, vertical vias, contact pads, etc. The insulating layers 740, 750 and 760 are formed with the same or similar materials as discussed above for the RDL structure 610 of FIG. 6A. While the exemplary embodiment of FIG. 7C illustrates the wafer-level RDL structure 730 comprising three redistribution layers, in other embodiments, the RDL structure 730 can include two or more redistribution layers, depending on the given application.

In some embodiments, when the first and second IC chips 710 and 720 are identical dies, the RDL structure 730 comprises a same pattern of RDL wiring for each of the IC chips 10 and 720. In other embodiments, when the first and second IC chips 710 and 720 are different types of IC dies, the RDL structure 730 comprises different patterns of RDL wiring for the IC chips 710 and 720. The RDL structure 730 can be constructed to provide fan-out wiring or fan-in wiring for the first and second IC chips 710 and 720, depending on the application.

For ease of illustration, the solder bumps 770 and 772 are generically depicted in FIG. 7C. However, it is to be understood that each array of solder bumps 770 and 772 can include mixed-pitch bumps, including fine-pitch bumps for connection to an interconnect bridge device using micro-solder bumps, and coarser pitch bumps for connection to the package substrate. Following formation of the intermediate wafer-level package structure shown in FIG. 7C, the handler substrate 708 is removed, and the wafer-level chip package is diced along the dashed lines to form individual chip packages 780-1 and 780-2, as shown in FIG. 7D.

Figure 7D:
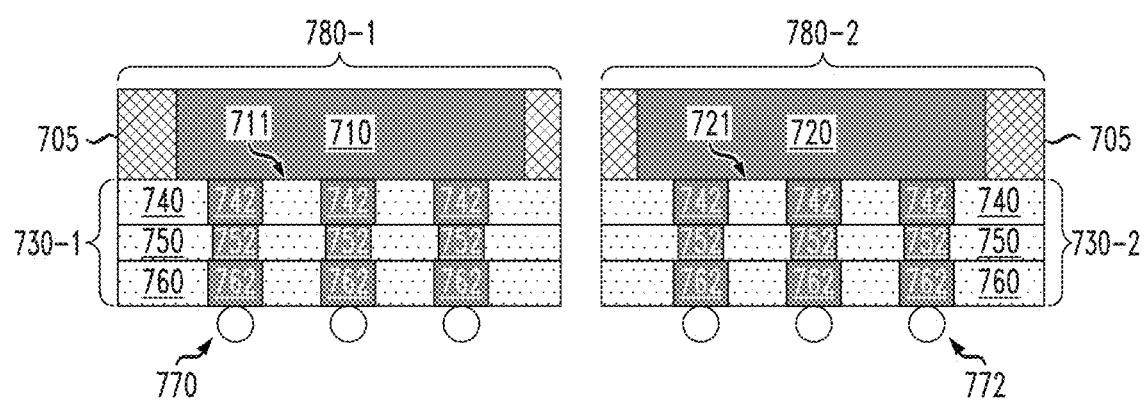

In particular, FIG. 7D schematically illustrates the individual chip-packages 780-1 and 780-2 comprising respective IC chips 710 and 720 and respective individual RDL structures 730-1 and 730-2. In some embodiments, when the IC chips 710 and 720 are identical dies, the chip packages 780-1 and 780-2 have substantially identical structures (e.g., individual RDL structures 730-1 and 730-2 are the same, and the arrays of solder bumps 770 and 772 are the same). In other embodiments, when the IC chips 710 and 720 are different dies, the chip packages 780-1 and 780-2 will have different structural configurations.

FIGS. 7A-7D schematically illustrates a "RDL last" process flow in which the individual chip package structures 780-1 and 780-2 are fabricated without solder bump connections between the IC chips 710 and 720 and the associated RDL structures 730-1 and 730-2. The individual chip package structures 780-1 and 780-2 are joined to an interconnect bridge and package substrates using any one of DBHi assembly techniques as discussed above to form a multi-chip package structures, such as shown in FIGS. 3, 4 and 5.

Although exemplary embodiments have been described herein with reference to the accompanying figures, it is to be understood that the disclosure is not limited to those precise embodiments, and that various other changes and modifications may be made therein by one skilled in the art without departing from the scope of the appended claims.

We claim:

1. A package structure, comprising:
a package substrate, wherein the package substrate comprises a recessed cavity formed in an upper surface of the package substrate;
an interconnect bridge device, wherein the interconnect bridge device is disposed within the recessed cavity;
a first chip package comprising a first redistribution layer structure and a first integrated circuit chip connected to the first redistribution layer structure, wherein the first redistribution layer structure is flip-chip connected to the interconnect bridge device and to the upper surface of the package substrate using a first array of solder bump connections between the first redistribution layer structure and the upper surface of the package substrate, and a second array of solder bump connections between the first redistribution layer structure and the interconnect bridge device; and
a second chip package comprising a second redistribution layer structure and a second integrated circuit chip connected to the second redistribution layer structure, wherein the second redistribution layer structure is flip-chip connected to the interconnect bridge device and to the upper surface of the package substrate using a third array of solder bump connections between the second redistribution layer structure and the upper surface of the package substrate, and a fourth array of solder bump connections between the second redistribution layer structure and the interconnect bridge device;
wherein the first and second redistribution layer structures are separate from each other;
wherein the interconnect bridge device comprises wiring to provide package-to-package connections between the first and second chip packages.

2. The package structure of claim 1, wherein the interconnect bridge device further comprises wiring to provide connections between the package substrate and at least one of the first and second chip packages.

3. The package structure of claim 1, wherein the first and second redistribution layer structures comprise fan-out redistribution layer structures.

4. The package structure of claim 1, wherein:
the first redistribution layer structure is formed directly on an active surface of the first integrated circuit chip; and
the second redistribution layer structure is formed directly on an active surface of the second integrated circuit chip.

5. The package structure of claim 1, wherein the first, second, third, and fourth arrays of solder bump connections each comprise solder bumps disposed at a bump pitch of 55 microns or less.

6. The package structure of claim 1, wherein:
the first and third arrays of solder bump connections each comprise solder bumps disposed at a bump pitch of greater than 55 microns; and
the second and fourth arrays of solder bump connections each comprise solder bumps disposed at a bump pitch of 55 microns or less.

7. The package structure of claim 1, wherein the interconnect bridge device comprises a build-up of multiple layers of inorganic dielectric material and patterned metallization to provide interlayer vias and lateral traces to form the wiring of the interconnect bridge device.

8. The package structure of claim 1, wherein the first integrated circuit chip comprises a memory die and wherein the second integrated circuit chip comprises a processor die.

9. The package structure of claim 1, wherein the package substrate comprises one of a ceramic substrate and an organic laminate build-up substrate.

10. The package structure of claim 1, wherein the first integrated circuit chip is connected to the first redistribution layer structure with an array of solder bumps.

11. The package structure of claim 1, wherein the first redistribution layer structure is disposed on an active surface of the first integrated circuit chip.

12. A package structure, comprising:
a package substrate comprising an upper surface;
an interconnect bridge device mounted to the upper surface of the package substrate;
a first chip package comprising a first redistribution layer structure and a first integrated circuit chip connected to the first redistribution layer structure, wherein the first redistribution layer structure is flip-chip connected to the interconnect bridge device and to the upper surface of the package substrate using a first array of solder bump connections between the first redistribution layer structure and the upper surface of the package substrate, and a second array of solder bump connections between the first redistribution layer structure and the interconnect bridge device; and
a second chip package comprising a second redistribution layer structure and a second integrated circuit chip connected to the second redistribution layer structure, wherein the second redistribution layer structure is flip-chip connected to the interconnect bridge device and to the upper surface of the package substrate using a third array of solder bump connections between the second redistribution layer structure and the upper surface of the package substrate, and a fourth array of solder bump connections between the second redistribution layer structure and the interconnect bridge device;
wherein the first and second redistribution layer structures are separate from each other;
wherein the interconnect bridge device comprises wiring to provide package-to-package connections between the first and second chip packages;
wherein the package structure comprises standoff connection structures disposed between the upper surface of the package substrate and the first and second chip packages, wherein the standoff connection structures are configured to offset a height of the interconnection bridge device mounted to the upper surface of the package substrate.

13. The package structure of claim 12, wherein the standoff structures comprise one of (i) copper pillar structures and (ii) solder-coated copper balls that are formed on contact pads on one of (i) upper surface of the package substrate, (ii) bottom sides of the first and second chip packages and (iii) both the upper surface of the package substrate and the bottom sides of the first and second chip packages.

14. The package structure of claim 12, wherein the interconnect bridge device further comprises wiring to provide connections between the package substrate and at least one of the first and second chip packages.

15. The package structure of claim 12, wherein the first and second redistribution layer structures comprise fan-out redistribution layer structures.

16. The package structure of claim 12, wherein:
the first and third arrays of solder bump connections each comprise solder bumps disposed at a bump pitch of greater than 55 microns; and
the second and fourth arrays of solder bump connections each comprise solder bumps disposed at a bump pitch of 55 microns or less.

17. The package structure of claim 12, wherein the interconnect bridge device comprises a build-up of multiple layers of inorganic dielectric material and patterned metallization to provide interlayer vias and lateral traces to form the wiring of the interconnect bridge device.

18. The package structure of claim 12, wherein the first integrated circuit chip comprises a memory die and wherein the second integrated circuit chip comprises a processor die.

19. The package structure of claim 12, wherein the first integrated circuit chip is connected to the first redistribution layer structure with an array of solder bumps.

20. The package structure of claim 12, wherein the first redistribution layer structure is disposed formed directly on an active surface of the first integrated circuit chip.

* * * * *